United States Patent [19]

Guild

[11] 4,423,138

[45] Dec. 27, 1983

[54] RESIST DEVELOPER WITH AMMONIUM OR PHOSPHONIUM COMPOUND AND METHOD OF USE TO DEVELOP O-QUINONE DIAZIDE AND NOVOLAC RESIST

[75] Inventor: John R. Guild, Rochester, N.Y.

[73] Assignee: Eastman Kodak Company, Rochester, N.Y.

[21] Appl. No.: 341,419

[22] Filed: Jan. 21, 1982

[51] Int. Cl.$^3$ .................... G03C 5/22; G03C 5/34; G03F 7/08

[52] U.S. Cl. .................... 430/326; 430/302; 430/309; 430/331; 252/156; 252/528; 252/529; 252/541; 252/547; 252/548

[58] Field of Search ............ 430/331, 309, 326, 325, 430/302; 252/547, 548, 541, 528, 529, 156

[56] References Cited

U.S. PATENT DOCUMENTS

| | | |
|---|---|---|
| 3,173,788 | 3/1965 | Wimmer et al. . |
| 3,637,384 | 1/1972 | Deutsch et al. . |
| 3,868,254 | 2/1975 | Wemmers .................... 430/331 |
| 4,141,733 | 2/1979 | Guild . |
| 4,174,222 | 11/1979 | Komine et al. . |
| 4,239,661 | 12/1980 | Muraoka et al. .................... 252/547 |
| 4,294,911 | 10/1981 | Guild . |
| 4,333,862 | 6/1982 | Smith et al. .................... 252/547 |

FOREIGN PATENT DOCUMENTS

| | | |
|---|---|---|
| 2105 | 1/1981 | European Pat. Off. . |
| 51-56226 | 5/1976 | Japan . |
| 1367830 | 9/1974 | United Kingdom . |

*Primary Examiner*—Charles L. Bowers, Jr.
*Attorney, Agent, or Firm*—Dana M. Schmidt

[57] ABSTRACT

There are disclosed resist developers in which additives selected from certain tetraalkylammonium or phosphonium cations, benzyltrialkylammonium or phosphonium cations, and benzyltriphenylammonium or phosphonium cations, are effective in enhancing the developer selectivity.

11 Claims, 2 Drawing Figures

RESIST DEVELOPER WITH AMMONIUM OR PHOSPHONIUM COMPOUND AND METHOD OF USE TO DEVELOP O-QUINONE DIAZIDE AND NOVOLAC RESIST

FIELD OF THE INVENTION

This invention relates to the field of resist developers and, more specifically, to those aqueous solutions used to develop an image in a positive-working resist.

BACKGROUND OF THE INVENTION

A number of developer solutions have been described for use with positive-working light-sensitive compositions such as photoresists and lithographic printing plates. Because alkaline solutions work so well with the quinone diazide compounds that comprise the majority of positive-working compositions, developers used have been primarily hydroxide solutions. Examples include tetramethylammonium hydroxide as described in British Pat. No. 1,367,830, published Sept. 25, 1974, and methyltriethanolammonium hydroxide as described in U.S. Pat. No. 4,141,733, issued on Feb. 27, 1979.

Another example of a useful hydroxide developer is tetraalkylammonium hydroxide as described for example in Japanese Publication No. 56226/76, published May 17, 1976. Such a developer comprises the noted quaternary ammonium hydroxide in an amount of from 1 to 2% by weight, wherein the alkyl portion has from 2 to 7 carbon atoms. The developer is said to be superior in a number of properties such as resolving power.

It has been found, however, that these developers tend to be deficient in developer selectivity—that is, the tendency of the developer to remove *only* the exposed portions of the light-sensitive composition and not any of the unexposed portions. To be useful, developer selectivity must be such as to produce a thickness loss in the unexposed portions that is no greater than 10% after development. However, losses approaching zero% are most desired. Such selectivity is important because it affects critical dimension control. That is, submicron dimensions of unexposed composition do not retain their tolerances if extended development has to be used. Extended development is the application of developer to the composition for a length of time in excess of the time needed for image clean-out. Such extended development is sometimes necessary in semiconductor fabrication, for example, if the resist is coated at varying thicknesses over an uneven substrate. In such cases the development used to clean out the thicker portions of the soluble resist cause the portions of lesser thickness to experience the extended development.

Particularly it has been found that a solution of greater than 1% by weight of $(C_nH_{2n+1})_4NOH$, wherein n is 2 to 7, has poor development selectivity, and is incapable of developing several useful positive-working resist compositions, even when used at reduced concentrations.

SUMMARY OF THE INVENTION

I have discovered an additive for the developers of positive-working resists, which additive protects the relatively insoluble portions from developer attack, thus increasing the developer selectivity. The amount of additive is selected to be less than the amount which also protects the relatively soluble resist portions from development and the amount of additive is less than the amount which along with the developer solute produces a development time longer than about 60 sec. Such additive comprises an anion and a soluble cation, different from the cation of the solute of the alkaline solution of the developer. The additive cation is selected from the group consisting of tetraalkylammonium or phosphonium, benzyltrialkylammonium or phosphonium, and benzyltriarylammonium or phosphonium, wherein said alkyl has from 2 to 7 carbon atoms and said aryl has from 6 to 10 nuclear carbon atoms.

Thus, there is advantageously featured a developer solution that provides enhanced developer selectivity for positive-working resists.

This and other advantageous features of the invention are achieved, more specifically, by a developer solution capable of differentially removing soluble portions of an exposed, positive-working, light-sensitive composition. The solution is improved by including the above-noted cation, in an amount which produces a development time no longer than about 60 sec. for a sufficiently exposed resist mixture containing a novolak resin and a quinone diazide. Development rates are selected to not exceed about 60 sec., as development times longer than 60 sec. are too slow to be practical.

Such a developer solution provides an improved method of selectively removing imagewise exposed layers comprising a quinone diazide and novolak resin composition, by the step of contacting such a layer for no longer than about 60 sec., with the noted solution.

The features and advantages of the invention will become apparent upon reference to the following Description of the Preferred Embodiments, when read in light of the attached drawings.

DESCRIPTION OF THE PREFERRED EMBODIMENTS

Figure 1:
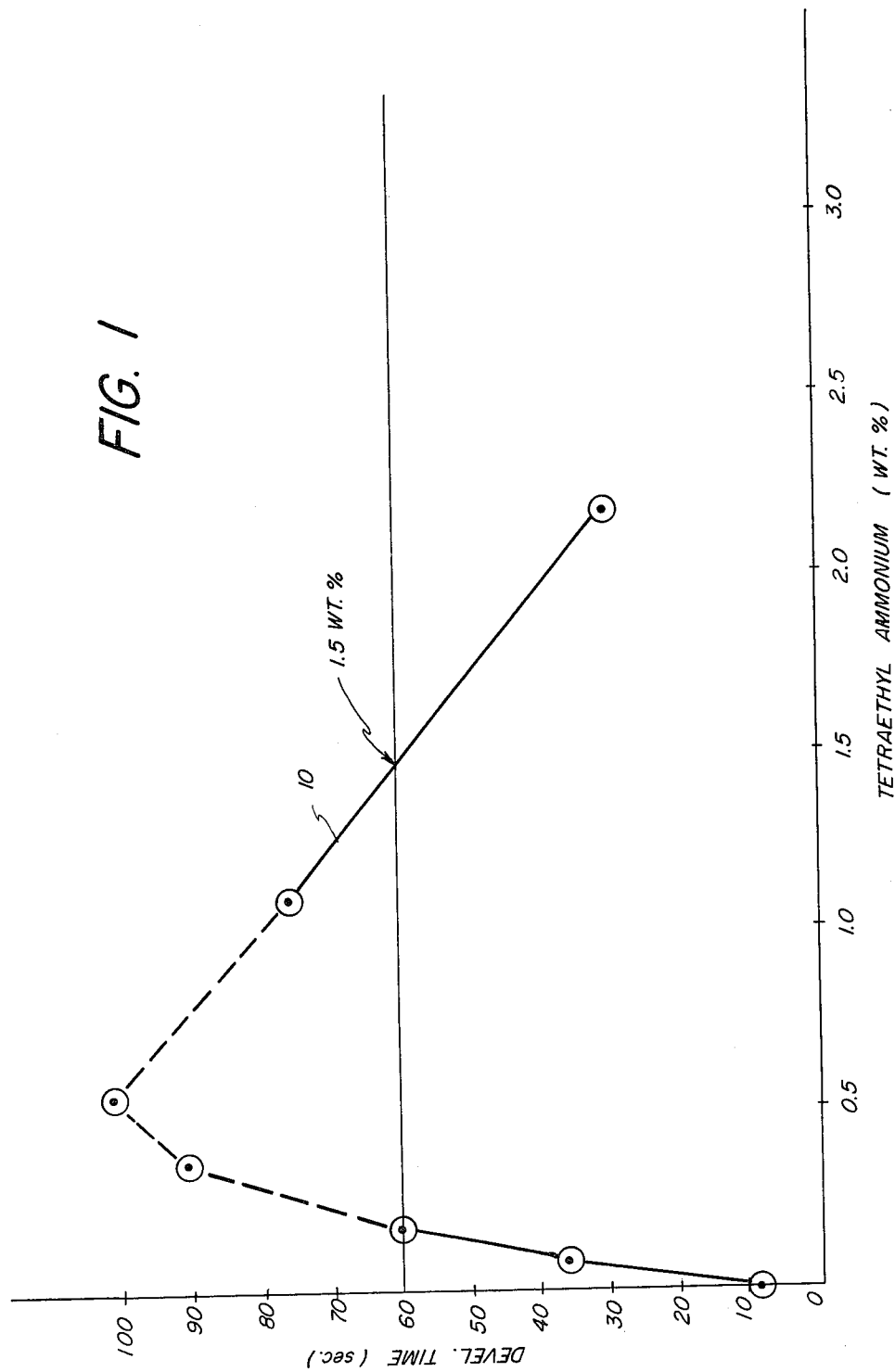
FIG. 1 is a graph of the concentration of the developer additive, tetraethylammonium hydroxide, plotted versus the development time.

The developer solution of the invention is useful with any sufficiently exposed, positive-working resist composition demonstrating differential solubility at the pH provided by the developer. Resists useful with this developer are those that are preferentially attacked in the exposed portions and relatively untouched in the unexposed portions by developer solutions.

As used herein, "sufficiently exposed" and "sufficiently imagewise-exposed" mean, exposed to a degree sufficient to resolve, when using a mask having image line widths of about 10.4μ, a cleaned-out resist image that deviates in width from that of the mask by no more than +0.25μ.

Resist compositions that have been found to respond to the developer solution of the invention with enhanced developer selectivity are not restricted to only one formulation. Rather, the developer solution of the invention is operative, with the noted improved results, with any resist composition which comprises a novolak resin and, as a light-sensitive component, a quinone diazide moiety which is either condensed with the resin, or is a monomer admixed with the resin, or is present both as part of the resin and as the monomer admixed therewith.

If the quinone diazide is condensed with the resin, it is preferably condensed through a linking group selected from the group consisting of sulfonyl, carbonyl, carbonyloxy, and sulfinyloxyl. Such condensation reaction is further explained in U.S. Pat. No. 4,294,911, the contents of which are expressly incorporated herein by reference. Useful examples of such quinone diazides are listed in said U.S. Pat. No. 4,294,911, of which 1,2-naphthoquinone-2-diazide-5-sulfonyl chloride is most preferred. Any of the novolak resins in the preparations described in the '911 patent is also useful for the above-noted condensation reaction. Most preferred are the esterified cresol-formaldehyde and phenol-formaldehyde resins having a weight average molecular weight of between about 1000 and about 10,000.

Useful monomeric quinone diazides are formed as esters of hydroxy-substituted aromatic or carbocyclic ring compounds. The ester linkage is preferably either a sulfonic acid ester or a carboxylic acid ester. Benzoquinone diazides and naphthoquinone diazides are both useful, specific examples of which are listed in col. 3, lines 6-35 of said U.S. Pat. No. 4,294,911. Highly preferred are di-or tri-1,2-naphthoquinone-2-diazide-5-sulfonates of di- or trihydroxy-substituted aromatic compounds, such as benzophenone, and carbocyclic ring compounds.

Non-light-sensitive compounds are also optionally useful in the resist composition. For example, one or more non-light-sensitive polymeric binders are preferably included. Useful examples of such binders include binders listed in the aforesaid U.S. Pat. No. 4,294,911, and most particularly, polymers and copolymers of alkyl methacrylates, having a weight-average molecular weight between about 500 and about 150,000.

Optionally, sensitivity-enhancing agents are also useful in the resist compositions developed by the developer of this invention. Useful examples of such agents include those described in commonly owned U.S. application Ser. No. 290,461, filed on Aug. 6, 1981, U.S. Pat. No. 4,365,019 by Daly et al, entitled "Positive-Working Resist Composition and Imaging Method Having Improved Development Rates." Specifically, such agents are polyhalogenated heterocyclic compounds having one, two or three rings, the nuclear atoms of which consist of carbon atoms and from 2 to 4 nitrogen atoms, at least one of the nitrogen atoms being bonded to hydrogen. Most preferred examples include polyhalogenated benzotriazole; 1,2-naphthotriazole; indazole; 6,7-di-hydro-5H-pyrrolotetrazole; and 1,3,4-imidazopyridine.

Still other optional components include dyes, pigments, surfactants, stabilizers, and the like, all of which are conventional.

The manner of preparing the resist composition and coating it onto a substrate or support, and of exposing such a coated composition, are conventional steps which require no further elaboration. Any conventional substrate or support is useful, and illustrative examples appear in the aforesaid U.S. Pat. No. 4,294,911.

The developer solution of the invention is an aqueous solution having a pH of at least 12.0 as provided by an appropriate caustic solute. Any solute effective to provide such a pH is useful. Preferred solutes are those selected from the group consisting of an inorganic hydroxide, tetramethylammonium hydroxide, tetraethylammonium hydroxide, methyltriethanolammonium hydroxide, sodium silicate, sodium silicate admixed with sodium phosphate, and mixtures of said solutes. Particularly useful inorganic hydroxides include NaOH, NH$_4$OH and KOH. Preferred mixtures of sodium silicate and trisodium phosphate are those in which the ratio of silicate to phsophate is between the range of about 1 to 2 and about 2 to 1. Most preferred, in the case of such a mixture, is a solution of 2.75% by weight of Na$_2$SiO$_3$.9H$_2$O and 4.0% by weight of Na$_3$PO$_4$.12H$_2$O. (Unless otherwise noted, all solution weight percents herein stated are measured per weight of the total solution.)

In accord with one aspect of the invention, the developer solution is improved by the addition of a cation as described in the Summary. Preferred examples of the tetraalkylammonium or phosphonium cations are those having the structural formula $$(C_nH_{2n+1})_4M^\oplus, \quad (1)$$

wherein n is from 2 to 7, such as ethyl, propyl, butyl and the like; and M is nitrogen or phosphorus. Preferred examples of benzyltrialkylammonium or phosphonium cations are those having the structural formula (2) $(C_mH_{2m+1})_3$—$M^\oplus$—$CH_2$— 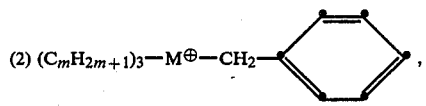, wherein m is from 1 to 5, for example, methyl, ethyl, propyl and the like, and M is nitrogen or phosphorus. Preferred examples of the benzyltriarylammonium or phosphonium cations are benzyltriphenylammonium or phosphonium.

The most preferred examples of the cation additives of the invention are tetraethylammonium, tetrapropylammonium, tetrabutylammonium, tetrapentylammonium, benzyltriethylammonium, benzyltriphenylphosphonium, and tetrabutylphosphonium.

The additives of the present invention are known compounds and/or are synthesizable by conventional techniques.

The actual concentration of a given cation additive, that provides a development time no greater than about 60 sec. and a thickness loss after development ≦10%, varies, depending upon the selection of the solute of the developer and the resist being developed. The preference for development times not exceeding 60 sec. imposes a limit to the amount of additive in some cases. This is particularly true of the additives having non-caustic anions, such as halide, phosphate, or nitrate. Within this group, the amount that will still allow 60 sec. or less development time depends upon the formula for the cation: generally the bulkier the organic groups present, the more protection the additive provides and the less the additive can be used before development times exceed 60 sec. The amount of cation additive required to reach this cut-off time of 60 sec. varies, depending upon the resist being developed, the solute selected for the developer, and its ability to dissolve the exposed resist. Examples for a given solute are set forth in the working examples which follow.

If the additive anion is itself caustic, for example, OH$^\ominus$, other amounts of additive are preferred. In such a case, any increase in additive also tends to introduce more caustic material. This encourages attack on the insoluble portions of the resist, to the point that, eventually, more than 10% of the "insoluble" resist is lost. Beyond this, the developer is considered unacceptable. Particularly this limit is encountered if the additive is tetraethylammonium hydroxide, due to the reduced length of the alkyl groups, and therefore the reduced ability of the alkyl groups to protect the insoluble portions of the resist. However, this latter mechanism appears to be operative only at the higher concentrations of the solute of the developer, the actual value of which depends upon the resist being developed. If the solute is present in lesser concentrations, and is tetramethylammonium hydroxide, the useful range of the tetraethylammonium hydroxide additive, when used with a particular resist, appears to be bimodal, as is more fully explained in the examples and the drawing.

The longer chain alkyls (6 or 7 carbon atoms) dissolve in the aqueous developer solutions in very minor amounts. However, as will be seen in the examples which follow, such minor amounts, e.g., amounts less than about 0.02 weight %, are effective.

By reason of the above discussion and the examples which follow, it is seen that any anion that permits the cation to be soluble in the developer solution, is useful. Preferred examples include chloride, bromide, iodide, fluoride, carbonate, phosphate, nitrate and hydroxide.

The preferred practice of the process of the invention is to imagewise expose the resist layer, and develop it by contacting it with the developer solution of the invention for no longer than about 60 sec.

EXAMPLES

The following examples further illustrate the invention.

In all of the following examples, the resist that was coated was the resist available from Hunt Chemical Company under the trademark "HPR-206", having the following composition:

| Ingredient | wt. % |
|---|---|
| novolak resin ($\overline{Mw}$ = 6000) | 22.6 |
| naphthoquinone diazide sulfonic acid ester of trihydroxybenzophenone | 4.1 |
| 2-ethoxyethyl acetate | 62.0 |
| butyl acetate | 6.2 |
| xylene | 5.1 |

The composition was applied to 5 cm diameter $SiO_2$ wafer substrates by spin-coating, to form dry film thicknesses of 1.0 to 1.5$\mu$, and pre-baked at 90° C. for 30 minutes in a convection oven. The resist layers were contact exposed through a high resolution chrome mask using an Oriel printer using a 200-watt mercury lamp. Exposed wafers were dip and dunk processed, at 22° C., in each of the developer formulations hereinafter set forth, until all exposed resist was completely removed. Two processing conditions were evaluated, one to determine the minimum development time required for complete clean-out of exposed resist, and the other to determine extended development latitude. For the latter, changes in resist film thickness were measured after 60 sec immersion in the developer on a Sloan Dektak film thickness analyzer. It is this thickness loss of the nominally insoluble resist portions that is a measure of developer selectivity—that is, the greater the loss, the less the selectivity. If the thickness loss was less than that of the control, then enhanced developer selectivity was demonstrated.

In addition, the size of a 10.4$\mu$ resist line (a) after initial clean-out and (b) after a 60 sec. extended development were measured on a Vickers image shearing measuring system, and compared. The difference in width between (a) and (b) appears as items $\Delta$C.D.

EXAMPLES 1-3

Table I lists the composition of the developers that were tested.

TABLE I

Control 1
100 cc tetramethylammonium hydroxide (10%) in water
100 cc distilled water
Control 2
100 cc tetramethylammonium hydroxide (10%) in water
(no additional water)
Control 3
100 cc tetramethylammonium hydroxide (10%) in water
400 cc distilled water
Control 4
100 cc tetraethylammonium hydroxide (10%) in water
100 cc distilled water
Control 5
100 cc tetraethylammonium hydroxide (10%) in water
(no additional water)
Control 6
100 cc tetrapropylammonium hydroxide (10%) in water
200 cc distilled water
Control 7
100 cc tetrapropylammonium hydroxide (10%) in water
(no additional water)
Control 8
100 cc tetrabutylammonium hydroxide (10%) in water
200 cc distilled water
Control 9
100 cc tetrabutylammonium hydroxide (10%) in water
(no additional water)
Control 10
100 cc tetramethylammonium hydroxide (10%) in water
300 cc distilled water
Example 1
100 cc tetramethylammonium hydroxide (10%) in water
296 cc distilled water
4 cc tetraethylammonium hydroxide (10%) in water
Example 2
100 cc tetramethylammonium hydroxide (10%) in water
292 cc distilled water
8 cc tetraethylammonium hydroxide (10%) in water
Control 11
100 cc tetramethylammonium hydroxide (10%) in water
284 cc distilled water
16 cc tetraethylammonium hydroxide (10%) in water
Control 12
100 cc tetramethylammonium hydroxide (10%) in water
275 cc distilled water
25 cc tetraethylammonium hydroxide (10%) in water
Control 13
100 cc tetramethylammonium hydroxide (10%) in water
250 cc distilled water
50 cc tetraethylammonium hydroxide (10%) in water
Example 3
100 cc tetramethylammonium hydroxide (10%) in water
200 cc distilled water
100 cc tetraethylammonium hydroxide (10%) in water

TABLE II

Relative Developer Selectivity

| Example | Amount of OH⊖ Solute (Wt %) | (molar) | pH | Amount of Cation Additive (Wt %) | (molar equiv.) | Development Rate (sec.) | Thickness Loss (at 60 sec.)* | ΔC.D. (at 60 sec.)** |
|---|---|---|---|---|---|---|---|---|
| Control 1 | 5.0 | (0.549) | 12.15 | 0 | | 4 | 10,000Å | −10.4μ |
| Control 2 | 10.0 | (1.099) | 12.30 | 0 | | 4 | 10,000Å | −10.4μ |
| Control 3 | 2.0 | (0.136) | — | 0 | | >120 | no development | not applicable |
| Control 4 | 5.0 | (0.34) | 11.95 | 0 | | >120 | no development | " |
| Control 5 | 10.0 | (0.68) | 12.35 | 0 | | 25 | 4600Å | −2.45μ |
| Control 6 | 3.33 | (0.164) | 12.06 | 0 | | >120 | no development | not applicable |
| Control 7 | 10.0 | (0.493) | 11.98 | 0 | | >120 | no development | " |
| Control 8 | 3.33 | (0.129) | 12.04 | 0 | | >120 | no development | " |
| Control 9 | 10.0 | (0.386) | 12.06 | 0 | | >120 | no development | " |
| Control 10 | 2.5 | (0.275) | 12.2 | 0 | | 9 | 600Å*** | −0.17μ |
| 1 | 2.5 | (0.275) | —c | 0.0884b | (0.007) | 37 | 100Å*** | −0.05μ |
| 2 | 2.5 | (0.275) | —c | 0.177 | (0.014) | 60 | 00Å*** | —(scum)a |
| Control 11 | 2.5 | (0.275) | —c | 0.354 | (0.027) | 90 | 00Å*** | not applicable |
| Control 12 | 2.5 | (0.275) | —c | 0.553 | (0.043) | 100 | 00Å*** | " |
| Control 13 | 2.5 | (0.275) | —c | 1.105 | (0.085) | 75 | 200Å*** | " |
| Ex. 3 | 2.5 | (0.275) | —c | 2.21 | (0.170) | 30 | 400Å*** | −0.67 |

*Except as noted, initial film thickness 10,000Å measurements are ± 100Å, for all examples of the application. Exposure was 5 sec. to Oriel.
**Equals difference between line width at complete development (nominally 10.4μ width) versus that width after 60 sec.
***Initial film thickness was 15,000Å. Exposure was 14 sec. to Oriel.
aThe scum was insufficient to render the results unacceptable.
bThe weight % of the compound is 0.1. Because the cation = 130/147 of the weight of the compound, the weight % of the cation is 0.0884. The weight % for the other cations was calculated by the same technique.
cThe small amount of cation additive will not appreciably change the pH of the solute.

Several important results are illustrated by Table II. Of the controls, although 2.5 weight %, and only 2.5 weight %, tetramethylammonium hydroxide, by itself, provided acceptable development rates for the test resist (Control 10), tetraethylammonium hydroxide used by itself was unsatisfactory. Even if used at 10 weight % (Control 5 compared with Controls 3 and 4), the thickness loss was unacceptable (46%). *None* of the longer chain tetraalkylammonium hydroxides could be made to work, when used as the sole ingredient of the developer at any tested concentration (Controls 3–9, covering tetraethyl through tetrapentyl). The addition of only 0.0884 weight % of tetraethylammonium cation, Example 1, to a 2.5 weight % solution of tetramethylammonium hydroxide, enhanced developer selectivity by reducing the thickness loss from 600 Å (Control 10) to only 100 Å. Doubling the amount of cation additive, Example 2, essentially eliminated the thickness loss entirely.

The data of Control 10, Examples 1–3, and Controls 11–13 are the basis for the plot of curve 10 in FIG. 1. Between 0.2 and 1.1 weight % concentration of the cation, the curve is shown as a dashed line because the location of the maximum is not clear. The importance of curve 10 is that, following the criterion that the development rate should not exceed 60 sec., the results are bimodal. For acceptable results in this embodiment, the amount of tetraethylammonium cation additive is either less than about 0.2 weight %, or it is greater than about 1.5 weight %.

EXAMPLES 4–9

Increased OH⊖ Solute Concentration

The procedure of Example 1 was repeated, using however a greater concentration of the tetramethylammonium hydroxide that was the solute of the developer solution (3.33 weight %). Thus, Control 14 is only this increased concentration of the tetramethylammonium hydroxide. The additive for Examples 4–9 was in each case, tetraethylammonium hydroxide. The concentrations of the cation portion of the additive and the results appear in Table III. Control 15 was prepared using 2.95 weight % cation additive.

TABLE III

| Example | Amount of OH⊖ Solute (Wt %) | (molar) | pH | Amount of Cation Additive (Wt %) | (molar equiv.) | Development Rate (sec.) | Thickness Loss (at 60 sec.)* | ΔC.D. (at 60 sec.) |
|---|---|---|---|---|---|---|---|---|
| Control 14 | 3.33 | (0.366) | 12.14 | 00 | (00) | 5 | 3200Å | −0.062 |
| Example 4 | 3.33 | (0.366) | — | 0.0884 | (0.007) | 8 | 1000Å | −0.17 |
| Example 5 | 3.33 | (0.366) | — | 0.177 | (0.014) | 11 | 400Å | −0.15 |
| Example 6 | 3.33 | (0.366) | — | 0.354 | (0.027) | 10 | 300Å | −0.05 |
| Example 7 | 3.33 | (0.366) | — | 0.531 | (0.041) | 13 | 300Å | −0.29 |
| Example 8 | 3.33 | (0.366) | — | 0.737 | (0.057) | 7 | 200Å | −0.15 |
| Example 9 | 3.33 | (0.366) | — | 1.48 | (0.113) | 7 | 1200Å | −0.11 |

TABLE III-continued

| Example | Amount of OH⊖ Solute (Wt %) | (molar) | pH | Amount of Cation Additive (Wt %) | (molar equiv.) | Development Rate (sec.) | Thickness Loss (at 60 sec.)* | ΔC.D. (at 60 sec.) |
|---|---|---|---|---|---|---|---|---|
| Control 15 | 3.33 | (0.366) | — | 2.95 | (0.226) | 5 | 5700Å | −1.52 |

*Initial film thickness 15,000Å, exposure 14 sec. to Oriel.

Clearly, only 0.0884 weight % (Ex. 4) is needed to reduce the thickness loss to less than 10% of the original. A plot of the results indicates that the upper limit of the acceptable thickness loss (1500 Å) is at about 1.6 weight %. These examples differ from Examples 1-2 in that it is the 10% cut-off in thickness loss, rather than the 60 sec. development time, that differentiates the useful concentration range of the cation additive.

EXAMPLES 10-12

Comparison Against Next Adjacent Homolog of the Prior Art

The purpose of these examples is to demonstrate that the invention provides superior developer selectivity compared to the next adjacent homolog described in the prior art. Specifically, the procedure of Example 4 was repeated, except the controls were a simulation of the developer available from Hunt Chemical Co. under the trade name Waycoat Positive LSI Metal-Ion-Free Developer, wherein a portion of the tetramethylammonium hydroxide is carbonated. To obtain such control developers, various concentrations of tetramethylammonium carbonate (hereinafter TMACO₃) were added as noted in Table IV, to 3.33 weight % tetramethylammonium hydroxide. Examples 10-12 were prepared by adding the noted concentrations of tetraethylammonium carbonate (hereinafter TEACO₃) to the 3.33 weight % of tetramethylammonium hydroxide. The results appear in Table IV.

TABLE IV

| Example | Amount of Ammonium Cation (wt %), | (molar equiv.) | Development (sec.) | Thickness loss* (at 60 sec.) | ΔC.D. (at 60 sec.) |
|---|---|---|---|---|---|
| | TMACO₃ | | | | |
| Control 16 | 0.0922 | (0.008) | 6 | 2700Å | −0.58μ |
| Control 17 | 0.182 | (0.016) | 6 | 2300Å | −0.50μ |
| Control 18 | 0.36 | (0.032) | 6 | 1800Å | −0.49μ |
| | TEACO₃ | | | | |
| Example 10 | 0.114 | (0.0052) | 6 | 700Å | −0.43μ |
| Example 11 | 0.226 | (0.0104) | 10 | 500Å | −0.21μ |
| Example 12 | 0.458 | (0.021) | 12 | 00Å | −0.17μ |

*Initial film thickness 15,000Å, exposure 14 sec. to Oriel.

For approximately equal weight % of cation additive, the TEACO₃ produces much less thickness loss, and thus much better developer selectivity, than does the adjacent homolog which is the Hunt developer containing TMACO₃.

EXAMPLES 13-24

The Effect of Increasing Bulk Size

These examples were run to ascertain the effect of increased chain length, and therefore bulk size, of the alkyl portion of the additive. The procedure of Example 4 was repeated, except that the additives were those noted in Table V. Controls 19-26 were obtained using the amount of cation additives noted in the Table.

TABLE V

Relative Developer Selectivity

| Developer Ref. | Additive | Cation Additive Amount (wt %), | (Molar equiv.) | Development (sec.) | Thickness Loss* (at 60 sec.) | ΔC.D. (at 60 sec.) |
|---|---|---|---|---|---|---|
| Control 14** | none | 00 | (00) | 5 | 3200Å | −0.62μ |
| Example 13 | tetraethyl-ammonium chloride | 0.259 | (0.020) | 5 | 600Å | −0.10μ |
| Example 14 | tetraethyl-ammonium chloride | 1.31 | (0.100) | 12 | 200Å | −0.06μ |
| Control 19 | tetraethyl-ammonium chloride | 2.62 | (0.201) | >60 | 200Å | Incomplete Development |
| Example 15 | tetrapropylammon-ium chloride | 0.277 | (0.0015) | 6 | 1100Å | −0.51μ |
| Example 16 | tetrapropylammon-ium chloride | 0.140 | (0.0075) | 6 | 200Å | −0.27μ |
| Example 17 | tetrapropylammon-ium chloride | 0.28 | (0.015) | 10 | 00Å | −0.20μ |
| Control 20 | tetrapropylammon-ium chloride | 0.563 | (0.030) | >60 | 00Å | Incomplete Development |
| Example 18 | tetrabutyl-ammonium chloride | 0.0148 | (0.0006) | 6 | 400Å | −0.23μ |
| Example 19 | tetrabutyl-ammonium chloride | 0.296 | (—) | 6 | 400Å | −0.23μ |

TABLE V-continued

| Developer Ref. | Additive | Cation Additive Amount (wt %) | (Molar equiv.) | Development (sec.) | Thickness Loss* (at 60 sec.) | ΔC.D. (at 60 sec.) |
|---|---|---|---|---|---|---|
| Example 20 | tetrabutyl-ammonium chloride | 0.0576 | (—) | 7 | 00Å | −0.01μ |
| Control 21 | tetrabutyl-ammonium chloride | 0.146 | (—) | >60 | 00Å | Incomplete Development |
| Example 21 | tetrapentyl ammonium chloride | 0.00089 | (—) | 6 | 1100Å | −0.00μ |
| Example 22 | tetrapentyl ammonium chloride | 0.0045 | (—) | 6 | 500Å | +0.05μ |
| Example 23 | tetrapentyl ammonium chloride | 0.015 | (0.0005) | 6 | 100Å | −0.03μ |
| Example 24 | tetrapentyl ammonium chloride | 0.030 | (0.001) | 7 | 00Å | −0.04μ |
| Control 22 | tetrapentyl ammonium chloride | 0.059 | (0.002) | >60 | 00Å | Incomplete Development |
| Control 23 | tetra-methyl-ammonium chloride | 0.113 | (0.015) | 5 | 2400Å | −0.78μ |
| Control 24 | tetra-methyl-ammonium chloride | 0.226 | (—) | 5 | 2900Å | −0.06μ |
| Control 25 | tetra-methyl-ammonium chloride | 1.13 | (—) | 5 | 5000Å | −1.00μ |
| Control 26 | tetra-methyl-ammonium chloride | 2.26 | (—) | 5 | 15000Å | −10.4μ |

*Initial film thickness = 15,000Å, exposure of 14 sec. to Oriel.
**Taken from Table III.

These examples demonstrate that, the longer the alkyl chain, the less additive is needed, and indeed can be tolerated, to produce the desired decrease in thickness loss. When the alkyl is pentyl, 0.059 weight % is too much (Control 22) as it causes greater than 60 sec. development time. The range for the tetrapentylammonium chloride is, instead, about 0.0008 to about 0.05 weight %.

Figure 2:
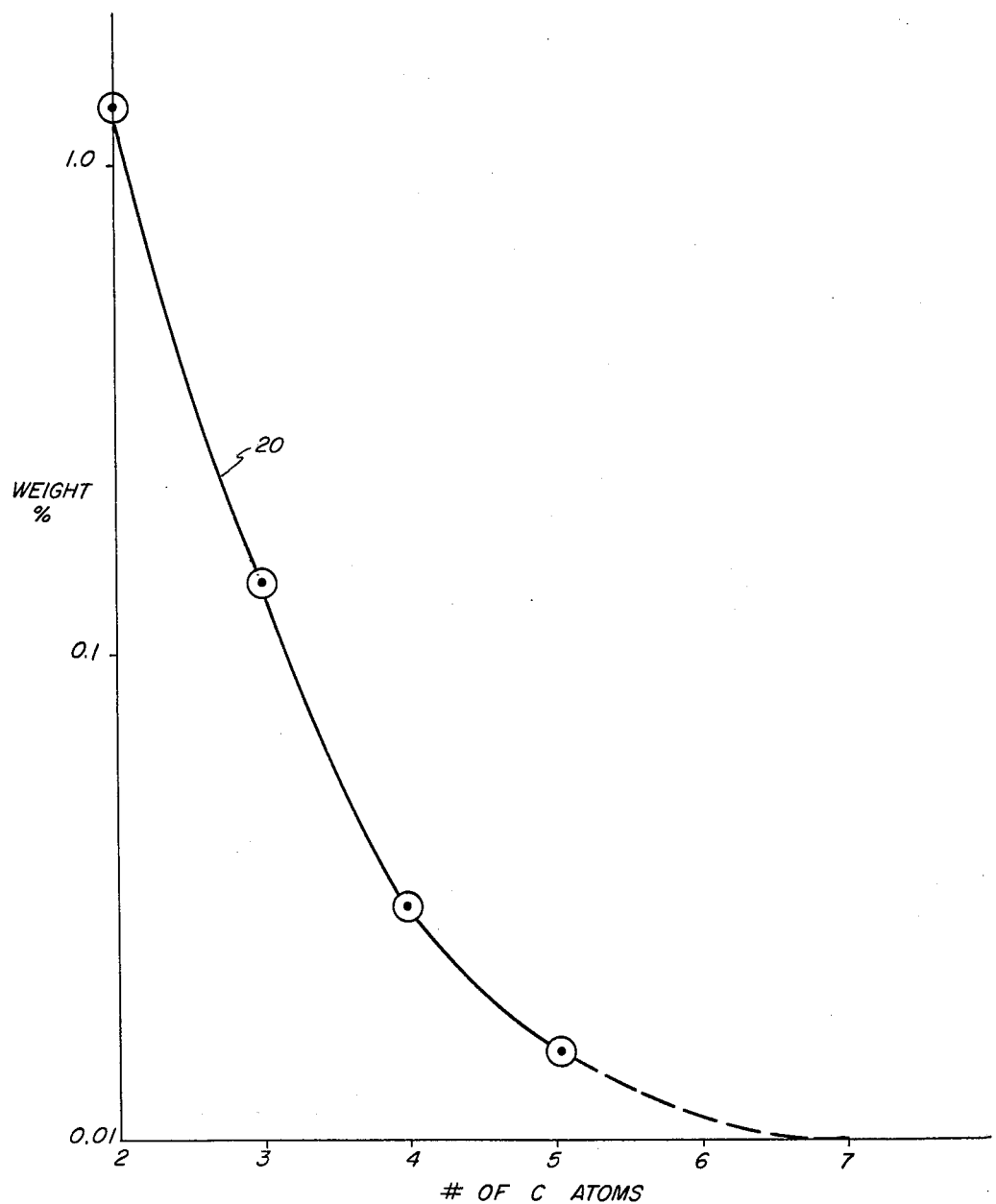
FIG. 2 is a semi-log graph of the weight % of the additive cation tetraalkylammonium needed to achieve a thickness loss of 200 Å or 400 Å or less, versus the number of carbon atoms in the alkyl moiety.

FIG. 2 is a plot of the weight % necessary to produce a thickness loss of only 200–400 Å, for the number of carbon atoms present in the tetraalkyl cations of Examples 13–24. The dotted portion of curve 20 indicates the anticipated weight % of tetrahexylammonium cation and tetraheptylammonium cation that should be effective to produce a thickness loss of only 200–400 Å, that is, no greater than about 0.0115 and 0.01, respectively. These are much less than the known water-solubility limits of these cations, when used with the chloride anion (0.08 molar and 0.02 molar equivalents, respectively.)

Examples 18–20 and Control 21 indicate that the preferred range of concentrations when the cation is tetrabutylammonium, is between about 0.01 and 0.1% of the weight of the solution.

Controls 23–26 are included to illustrate that the tetramethylammonium chloride additive, which is not part of the invention, is incapable of producing a thickness loss no greater than 1500 Å (10%).

EXAMPLES 25–30

Other Additives of the Invention

The procedure of Example 4 was repeated, except that the additives were those noted in Table VI.

TABLE VI

| Developer Ref. | Additive | Cation Additive Amount (wt %) | (Molar equiv.) | Development (sec.) | Thickness Loss* (at 60 sec.) | ΔC.D. (at 60 sec.) |
|---|---|---|---|---|---|---|
| Control 14** | none | 00 | (00) | 5 | 3200Å | −0.62μ |
| Example 25 | benzyl-triethyl-ammonium chloride | 0.014 | (0.0007) | 5 | 800Å | −0.21μ |
| Example 26 | benzyl-triethyl- | 0.028 | (0.0014) | 6 | 400Å | −0.09μ |

TABLE VI-continued

Relative Developer Selectivity

| Developer Ref. | Additive | Cation Additive Amount wt %), | (Molar equiv.) | Development (sec.) | Thickness Loss* (at 60 sec.) | ΔC.D. (at 60 sec.) |
|---|---|---|---|---|---|---|
| Example 27 | ammonium chloride benzyl-triethyl-ammonium chloride | 0.057 | (0.0028) | 10 | 200Å | −0.05μ |
| Control 27 | benzyl-triethyl-ammonium chloride | 0.141 | (0.0073) | >60 | 00Å | Incomplete Development |
| Example 28 | benzyl-triphenyl-phosphonium chloride | 0.015 | (0.0004) | 7 | 100Å | Adhesion loss*** |
| Example 29 | benzyl-triphenyl-phosphonium chloride | 0.030 | (0.0008) | 10 | 00Å | " |
| Example 30 | benzyl-triphenyl-phosphonium chloride | 0.060 | (0.0016) | 20 | 00Å | " |
| Control 28 | benzyl-triphenyl-phosphonium chloride | 0.152 | (0.0043) | >60 | 00Å | no development |

*Initial film thickness 15,000Å, exposure 14 sec. to Oriel.
**Taken from Table III.
***Avoidable by the use of an adhesion promoter such as hexamethyldisilazane.

EXAMPLES 31–36

Variation In Anions Produces No Difference

The procedure of Example 4 was repeated, using however the additives of Table VII, wherein only the anion is different.

TABLE VII

Relative Developer Selectivity Using Different Anions

| Example | Additive | Cation Additive Amount wt %, | (Molar equiv.) | Development (sec.) | Thickness Loss* (at 60 sec.) | ΔC.D. (at 60 sec.) |
|---|---|---|---|---|---|---|
| Control 14** | none | 0.00 | (0.00) | 5 | 3200Å | −0.62μ |
| Ex. 31 | $(C_4H_9)_4NCl$ | 0.0576 | (0.0024) | 7 | 100Å | −0.05μ |
| Ex. 32 | $(C_4H_9)_4NBr$ | 0.0576 | (0.0024) | 6 | 100Å | −0.02μ |
| Ex. 33 | $(C_4H_9)_4NI$ | 0.0576 | (0.0024) | 6 | 200Å | −0.04μ |
| Ex. 34 | $(C_4H_9)_4NH_2PO_4$ | 0.0576 | (0.0024) | 6 | 200Å | −0.04μ |
| Ex. 35 | $(C_4H_9)_4NNO_3$ | 0.0576 | (0.0024) | 25 | 00Å | −0.05μ |
| Ex. 36 | $(C_4H_9)_4NOH$ | 0.0576 | (0.0024) | 10 | 300Å 100Å | −0.04μ |

*Initial film thickness 15,000Å, exposure 14 sec. to Oriel.
**Taken from Table III.

EXAMPLE 37

Example of Phosphonium Additive

The procedure of Example 32 was repeated, except the cation additive was 0.0024 molar equivalent (0.07 weight %) tetrabutylphosphonium bromide. The results were, development time=7 sec., thickness loss (at 60 sec.)=00 Å, ΔC.D.==0.24μ. These results were fully comparable to Ex. 32.

EXAMPLE 38

Use With Inorganic Solute

The procedure of Example 23 was repeated, except that the solute of the developer solution was the developer obtained from Hunt Chemical Co. under the trade name Waycoat Positive LSI Developer, instead of 3.3 weight % tetramethylammonium hydroxide, providing a pH of 12.30. This LSI Developer comprises a mixture of 2.4 weight % of trisodium phosphate and 1.8 weight % of sodium silicate. The mixture is free of tetramethylammonium hydroxide. The results were as follows: development time=40 sec., thickness loss (at 60 sec.)=00 Å, and ΔC.D.=00μ. As a control, this procedure was repeated, using however the Waycoat Positive LSI Developer without any additive. Development time was 9 sec, producing a thickness loss of 4600 Å and a ΔC.D. of −1.60μ.

The invention has been described in detail with particular reference to preferred embodiments thereof, but it will be understood that variations and modifications can be effected within the spirit and scope of the invention.

What is claimed is:

1. In an aqueous developer solution for a positive-working light-sensitive composition, the solution including a solute effective to provide a pH of at least 12.0;

the improvement wherein said solution includes a cation selected from the group consisting of tetraalkylammonium or phosphonium wherein each said alkyl individually has from 2 to 7 carbon atoms, benzyltrialkylammonium or phosphonium wherein each alkyl of said trialkyl individually has from 1 to 5 carbon atoms, and benzyltriarylammonium or phosphonium wherein each said aryl individually has from 6 to 10 nuclear atoms;

and an anion for said cation;

said cation being (a) different from the cations of said solute and (b) present in solution in an amount which enhances the selectivity of the solution and which, along with the solute, produces a development time no longer than about 60 sec. for a sufficiently imagewise-exposed resist composition comprising a (1) cresol-formaldehyde resin with a weight average molecular weight of about 6000 in admixture with (2) about 18% by weight of said resin of a quinone diazide sulfonic acid ester of a trihydroxy benzophenone.

2. A developer solution as defined in claim 1, wherein said cation is tetrapentylammonium.

3. A developer solution as defined in claim 1 or 2, wherein said anion is selected from the group consisting of chloride, bromide, iodide, fluoride, carbonate, phosphate, nitrate, and hydroxide.

4. A developer solution as defined in claim 1 or 2, wherein said solute is tetramethylammonium hydroxide.

5. A developer solution as defined in claim 1, wherein said solute is tetramethylammonium hydroxide, and wherein said cation is tetrabutylammonium or phosphonium.

6. A developer solution as defined in claim 5, wherein said solute comprises about 3.3% by weight of said solution, and said cation comprises between about 0.01 and 0.1 weight percent of the solution.

7. A developer solution as defined in claim 1, wherein said solute is tetramethylammonium hydroxide, and wherein said cation is tetraethylammonium.

8. A developer solution as defined in claim 7, wherein said solute comprises about 2.5% by weight of the solution, and wherein said cation comprises either less than about 0.2% or greater than about 1.5% of the weight of the solution.

9. A developer solution as defined in claim 7, wherein said solute comprises about 3.3% by weight of the solution and wherein said cation comprises between about 0.08 and about 1.6% of the weight of the solution.

10. In a developer solution capable of differentially removing soluble portions of an exposed, positive-working light-sensitive composition, the solution having a pH of at least 12.0, and comprising tetramethylammonium hydroxide, the improvement wherein said solution further includes the cation tetrapentylammonium, and an anion, said cation being present from between about 0.0008% and about 0.05% of the weight of the solution.

11. A method of selectively developing a sufficiently imagewise-exposed layer of a light-sensitive novolak and quinone diazide composition, comprising contacting said layer with an aqueous solution of a solute effective to provide a pH of at least 12.0; and a cation soluble in said solution and selected from the group consisting of tetraalkylammonium or phosphonium wherein each said alkyl individually has from 2 to 7 carbon atoms, benzyltrialkylammonium or phosphonium wherein each alkyl of said trialkyl individually has from 1 to 5 carbon atoms, and benzyltriarylammonium or phosphonium wherein each said aryl individually has from 6 to 10 nuclear carbon atoms; and an anion for said cation; said cation being different from the cations of said solute; to remove exposed areas of said layer.

* * * * *